(12) United States Patent
Gotoh et al.

(10) Patent No.: US 7,449,362 B2
(45) Date of Patent: Nov. 11, 2008

(54) ONE-COMPONENT HOT-SETTING EPOXY RESIN COMPOSITION AND SEMICONDUCTOR MOUNTING UNDERFILL MATERIAL

(75) Inventors: Johshi Gotoh, Takatsuki (JP); Tatsuya Okuno, Takatsuki (JP)

(73) Assignee: Sunstar Giken Kabushiki Kaisha, Osaka-fu (JP)

( * ) Notice: Subject to any disclaimer, the term of this patent is extended or adjusted under 35 U.S.C. 154(b) by 42 days.

(21) Appl. No.: 10/472,191

(22) PCT Filed: Mar. 29, 2002

(86) PCT No.: PCT/JP02/03151

§ 371 (c)(1),
(2), (4) Date: Jun. 2, 2004

(87) PCT Pub. No.: WO02/079294

PCT Pub. Date: Oct. 10, 2002

(65) Prior Publication Data

US 2004/0209403 A1   Oct. 21, 2004

(30) Foreign Application Priority Data

Mar. 30, 2001 (JP) ................................ 2001-99479

(51) Int. Cl.
*H01L 21/66* (2006.01)
*H01L 21/00* (2006.01)

(52) U.S. Cl. ............................ 438/106; 438/15; 438/25; 438/26; 438/51; 438/55; 438/64; 438/112; 438/124; 438/126; 438/127

(58) Field of Classification Search ....................... None
See application file for complete search history.

(56) References Cited

U.S. PATENT DOCUMENTS

| 4,652,398 | A  | * | 3/1987  | Goswami et al. ............. 252/514 |
| 5,250,848 | A  | * | 10/1993 | Christie et al. ............... 257/778 |
| 5,565,460 | A  |   | 10/1996 | Suzuki et al. |
| 5,641,996 | A  | * | 6/1997  | Omoya et al. ................ 257/787 |
| 5,985,043 | A  |   | 11/1999 | Zhou et al. |
| 5,985,456 | A  | * | 11/1999 | Zhou et al. ................... 428/414 |
| 6,172,141 | B1 | * | 1/2001  | Wong et al. .................. 523/455 |
| 6,180,696 | B1 | * | 1/2001  | Wong et al. .................. 523/457 |
| 6,222,035 | B1 |   | 4/2001  | Tsumuki et al. |
| 6,274,389 | B1 | * | 8/2001  | Iida et al. ........................ 438/4 |
| 6,297,560 | B1 | * | 10/2001 | Capote et al. ................ 257/778 |
| 6,335,571 | B1 | * | 1/2002  | Capote et al. ................ 257/787 |
| 6,376,100 | B1 | * | 4/2002  | Shiobara et al. ............. 428/620 |
| 6,395,124 | B1 | * | 5/2002  | Oxman et al. ............. 156/275.5 |
| 6,402,881 | B1 | * | 6/2002  | Carey et al. .................. 156/329 |
| 6,417,573 | B1 | * | 7/2002  | Pendse ......................... 257/778 |
| 6,545,000 | B1 |   | 4/2003  | Shimada et al. |
| 6,579,868 | B1 |   | 6/2003  | Asano et al. |
| 6,653,371 | B1 | * | 11/2003 | Burns et al. .................. 523/455 |
| 6,746,896 | B1 | * | 6/2004  | Shi et al. ...................... 438/108 |
| 7,108,920 | B1 | * | 9/2006  | Crane et al. .................. 428/414 |
| 2001/0003058 | A1 | * | 6/2001  | Gilleo et al. ................. 438/612 |
| 2001/0034382 | A1 | * | 10/2001 | Sumita et al. ................ 523/466 |
| 2002/0013420 | A1 | * | 1/2002  | Wang et al. .................. 525/406 |
| 2002/0105093 | A1 | * | 8/2002  | Papathomas ................. 257/778 |

FOREIGN PATENT DOCUMENTS

| JP | 62-124113     | 6/1987  |
| JP | 62-124115     | 6/1987  |
| JP | 62-172014     | 7/1987  |
| JP | 63-81119      | 4/1988  |
| JP | 11 140165 A   | 5/1999  |
| JP | 2002-31187    | 1/2000  |
| JP | 2000 080149 A | 3/2000  |
| JP | 2000-216300   | 8/2000  |
| JP | 2000 216300   | 8/2000  |
| JP | 2000 297201 A | 10/2000 |
| JP | 2002-97257    | 4/2002  |
| WO | WO 95/03806   | 2/1995  |
| WO | WO 98/31738   | 7/1998  |
| WO | WO 98/32159   | 7/1998  |
| WO | WO 98/42711   | 10/1998 |
| WO | WO 99/35147   | 7/1999  |
| WO | WO 00/17201   | 3/2000  |
| WO | WO 02/070191  | 9/2002  |

* cited by examiner

*Primary Examiner*—Jack Chen
*Assistant Examiner*—James M Mitchell
(74) *Attorney, Agent, or Firm*—Jacobson Holman PLLC

(57) ABSTRACT

The present invention provides an one-pack thermosetting type epoxy resin composition which is useful as an underfilling material used when a flip chip or a semiconductor package comprised of a semiconductor element held on a carrier base being mounted onto a wiring substrate; which can omit a fluxing process as adopted for improvement of the bonding force of bumps or solder balls particularly at said mounting and exhibits a good voidless property even at a reflow temperature; and which can be also applied as an adhesive, a paint, a coating material, a sealing material, or the like.

The one-pack thermosetting type epoxy resin composition of the present invention comprises as essential ingredients, a liquid epoxy resin and a carboxylic acid having two or more carboxylic groups in molecule as a curing agent.

1 Claim, No Drawings

US 7,449,362 B2

ONE-COMPONENT HOT-SETTING EPOXY RESIN COMPOSITION AND SEMICONDUCTOR MOUNTING UNDERFILL MATERIAL

This is a nationalization of PCT/JP02/03151 filed on Mar. 29, 2002 and published in Japanese.

TECHNICAL FIELD

The present invention relates to an one-pack thermosetting type epoxy resin composition and an underfilling material for semiconductor mounting, and more particularly to an one-pack thermosetting type epoxy resin composition which is useful as an underfilling material used when a flip chip or a semiconductor package comprised of a semiconductor element held on a carrier base being mounted onto a wiring substrate; which can omit a fluxing process as adopted for improvement of the bonding force of bumps or soldering balls particularly at said mounting and exhibits a good voidless property even at a reflow temperature; and which can be also applied as an adhesive, a paint, a coating material, a sealing material, or the like in addition to the application of such an underfilling material because of having an adhesive performance and a tough setting physical property.

BACKGROUND ART

This type of semiconductor mounted board is used for applications requiring high reliance such as automobile apparatuses, computers, etc., and in small portable apparatuses such as PDAs (Personal Digital Assistants), clocks and watches, portable phones, cameras, etc., but it is usually produced by mounting a flip chip or a semiconductor package comprised of a semiconductor element held on a carrier base onto a wiring substrate, for example, by connecting them via bumps or solder balls. However, in the case of portable phones, a bond-failure of the bumps or the solder balls may occur by the deformation of the substrate caused by falling shock, external pressure generated with the operation of buttons, etc., and hence, a reinforcing measure is employed by filling the gaps between the bonded parts with an underfilling material and curing it to encapsulate them.

In the meantime, when oxide is formed on a solder surface, it gives adverse effects on the bonding force, and hence, a method is usually employed by applying an alcohol solution of a flux (a pine resin component consisting of abietic acid) onto the bonded surface to remove the oxide, and connecting with solder balls, followed by washing and removing the applied flux before the application of an underfilling material.

Thus, the fluxing process is adopted for improvement of the bonding force of bumps or solder balls, but it requires two steps (flux applying and cleaning or removing steps.

On the other hand, in the prior art a thermosetting type epoxy resin composition is used as the aforesaid underfilling material, but if an acid anhydride commonly used as a curing agent is used, it requires the aforesaid step of fluxing process and moreover, when the temperature goes high (to reflow temperature), it has volatilized and may invite generation of voids as a result.

DISCLOSURE OF INVENTION

When the present inventors made intense studies in view of the problems of said fluxing process and voids, namely, for the purpose of developing an underfilling material having a flux performance, being suitable also to a high-melting point solder, having no volatility, and having a so-called voidless property, they found that if a carboxylic acid having two or more carboxyl groups in molecule including dicarboxylic acid is used as a curing agent, the resultant underfilling material exhibits a flux performance and can ensure a voidless property even under a high temperature such as a reflow temperature condition because of having a good heat resistance.

It has been also shown that if said curing agent is used, the resultant underfilling material has a good adhesive performance to aluminum and various other metals and moreover has a tough setting physical property, and hence, its use can be enlarged to applications such as an adhesive (particularly a structural adhesive), a paint, a coating material, a sealing material, etc.

The present invention has been completed on the basis of such findings, and it provides (1) an one-pack thermosetting type epoxy resin composition which comprises as essential ingredients, a liquid epoxy resin and a carboxylic acid having two or more carboxylic groups in molecule as a curing agent; (2) a semiconductor mounted board which comprises a wiring substrate and a flip chip or a semiconductor package comprised of a semiconductor element held on a carrier base, said flip chip or semiconductor package being connected to said wiring substrate via bumps or solder balls; and the gaps between the bonded parts being encapsulated with an underfilling material, which is characterized in that the aforesaid one-pack thermosetting type epoxy resin composition is used as the aforesaid underfilling material; and (3) a mounting method of the aforesaid semiconductor mounted board, which comprises performing a step of connecting the flip chip or the semiconductor package to the wiring substrate via bumps or solder balls and a step of encapsulating the gaps between the bonded parts with the one-pack thermosetting type epoxy resin composition as a underfilling material, in order or in reverse order or simultaneously to omit a fluxing process.

The liquid epoxy resin in the present invention includes, for example, bisphenol type epoxy resin (bisphenol A type, bisphenol F type, bisphenol AD type, and the like); novolak type epoxy resin (phenol novolak type, cresol novolak type, and the like); naphthalene type epoxy resin; biphenyl type epoxy resin; cyclopentadiene type epoxy resin or the like. Further, in addition to such epoxy components, one may add various modified epoxy resins, for example, vegetable oil-modified epoxy resins (castor oil-modified, linseed oil-modified, soybean oil-modified epoxy resins and the like), rubber-modified epoxy resins (polyisoprene-modified, polychloroprene-modified, polybutadiene-modified, acrylonitrile-butadiene copolymer-modified epoxy resins and the like), dimer acid-modified epoxy resins and the like in a range of suitable amount.

As said carboxylic acid used as a curing agent in the present invention, those having a melting point (m. p.) of 80° C. or higher, preferably 150° C. or higher and not subliming at 300° C. or lower are suitable. Such carboxylic acid includes, for example, adipic acid, isophthalic acid, terephthalic acid, cyclohexanedicarboxylic acid, succinic acid, butanetetracarboxylic acid, tetrahydrophthalic acid, methyltetrahydrophthalic acid, hexahydrophthalic acid, methylhexahydrophthalic acid, maleic acid, dodecenylsuccinic acid, chlorendic acid, sebacic acid, dodecanedicarboxylic acid, pyromellitic acid, trimellitic acid, cyclopentanetetracarboxylic acid, azelaic acid, icaphoronic acid, 9,10-epoxystearic acid, camphoronic acid, glutaric acid, cyclopropanedicarboxylic acid, cyclopentanedicarboxylic acid, citraconic acid, dimethylsuccinic acid, phenylsuccinic acid, dimethoxyphthalic acid, oxalic acid, suberic acid, tetramethylsuccinic acid, naphthalenedicarboxylic acid, 1,2,3-propanetricarboxylic acid, malonic acid, mesaconic acid, mesoxalic acid, endomethylenetetrahydrophthalic acid, 5-(2,5-dioxotetrahydoxyfuryl)-3-methyl-3-cyclohexene-1,2-dicarboxylic acid, methylnadic acid, 3,3',4,4'-tetracarboxybenzophenone, bis(3,4-dicarboxyphenyl)dimethylsilane, 1,2,3,4-butanetetracarboxylic acid, bis(exo-bicyclo[2.2.1]heptane-2,3-dicarboxylic acid)sulfone, 2,2-bis(3,4-dicarboxyphenoxyphenyl) hexafluoropropane, 1,3-bis(2-hydroxyhexafluoroisopropyl) benzenebis(trimellitic acid), 3,3',4,4'-biphenyltetracarboxylic acid, 2,3,3',4'-benzophenonetetracarboxylic acid, 2,3,6,7-tetracarboxynaphthalene, 2,2'-bis(3,4-dicarboxyphenyl) propane, 3,4,9,10-perylenetetracarboxylic acid, benzene-1,2,3,4-tetracarboxylic acid, 2,6-dichloronaphthalene-1,4,5,8-tetracarboxylic acid, pyrrolidine-2,3,4,5-tetracarboxylic acid, or the like.

In addition to such an essential curing agent, any conventional acid anhydride (for example, methyltetrahydrophthalic anhydride, methylhexaphthalic anhydride, methylhymic anhydride, trialkyl phthalic anhydride, tetrahydrophthalic anhydride, hexahydrophthalic anhydride, dodecylsuccinic anhydride, methylnadic anhydride, maleic anhydride, pyromellitic anhydride, chlorendic anhydride, and the like) may be also used such that the flux performance and the voidless property are not hindered.

Further, if need, as a cure accelerating catalyst, 2,4-diamino-6-[2'-methylimidazolyl-(1)']-ethyl-S-triazine, 2,4-diamino-6-[2'-ethyl-4'-methylimidazolyl-(1)']-ethyl-S-triazine, 2,4-diamino-6-[2'-methylimidazolyl-(1)']-ethyl-S-triazine isocyanuric acid adduct, 2-phenyl-4-methyl-5-hydroxymethylimidazole, 2-phenyl-4,5-dihydroxymethylimidazole, 2-phenyl-4,5-dihydroxymethylimidazole, 2-aryl-4,5-diphenylimidazole, 2,4,5-triphenylimidazole, and the like may be formulated in a suitable amount.

The one-pack thermosetting type epoxy resin composition according to the present invention may consist of a system obtained by blending the aforesaid liquid epoxy resin (optionally modified epoxy resin) with the aforesaid carboxylic acid as a curing agent (optionally acid anhydride and further a cure accelerating catalyst), and if need, adding conventional inorganic filler (molten silica, crystal silica, spherical silica, alumina, boron nitride, aluminum nitride, silicon nitride, magnesia, magnesium silicate, talc, calcium carbonate, aluminum hydroxide, and the like), anti-foaming agent, coupling agent, leveling agent, dye, pigment, rust-preventing agent, and the like thereto in a suitable amount, and is in particular useful as an underfilling material for semiconductor mounting as described below.

Besides, for this underfilling material application, an organosilicone compound (for example, silane coupling agent, terminal silanol group containing organopolysilicone, polyether-modified silicone, and the like) may be formulated typically in an amount of 0.01 to 10% by weight in the total amount of the composition in order to optionally improve an adhesion and a penetrating property.

Further, in addition to such an underfilling material application, the present composition can be also applied as an adhesive, a paint, a coating material, a sealing material, and the like because of having an adhesive performance and a tough setting physical property. In such a use, further if need, conventional additives, for example, reactive diluting agent (butyl glycidyl ether, N,N'-diglycidyl-o-toluidine, phenyl glycidyl ether, styrene oxide, ethylene glycol diglycidyl ether, propylene glycol diglycidyl ether, 1,6-hexanediol diglycidyl ether, and the like), non-reactive diluting agent (dioctyl phthalate, dibutyl phthalate, dioctyl adipate, petroleum-series solvents, and the like) and others may be formulated in a suitable amount.

The semiconductor mounted board according to the present invention can be produced using the aforesaid one-pack thermosetting type epoxy resin composition as an underfilling material of the semiconductor mounting as follows:

Namely, the semiconductor mounting is carried out by performing a step of connecting a flip chip or a semiconductor package to a wiring substrate (for example, a substrate made of glass epoxy resin, ABS resin, phenolic resin, or the like) via bumps (having a height of 10 to 100 µm) or solder balls (having a height of 300 to 800 µm) (with a ball pitch of 20 to 500 µm) and a step of applying an underfilling material (the one-pack thermosetting type epoxy resin composition of the present invention) into the gaps between the bonded parts with a liquid precision quantitating ejection apparatus and curing it to encapsulate them through a heat treatment at 130 to 270° C. for 2 seconds to 6 hours, in order or in reverse order or simultaneously. In this way, even if the fluxing process as adopted for improvement of the bonding force of the bumps or solder balls is omitted, sufficiently satisfactory bonding force can be ensured.

Here, said flip chip consists by holding a semiconductor element (LSI or the like) on a carrier base (for example, a base or tape made of ceramics such as $Al_2O_3$, $SiN_3$, $Al_2O_3/SiO_2$ or heat-resistant resin such as polyimide resin; a base made of the same material as said wiring substrate), namely, electrically connecting a semiconductor element and a carrier base with bumps or high-melting solder balls or anisotropic electrically conductive adhesive or wire connection, or the like, and in the case of said semiconductor package it consists by further sealing with a suitable resin in order to enhance the reliability and the endurance of connection. A bare chip, a chip size package (CSP), or a ball grid array (BGA) may be illustrated.

BEST MODES FOR CARRYING OUT THE INVENTION

Hereinafter, the present invention will be described in more detail in reference to the following Reference Examples, Examples, and Comparative Examples.

REFERENCE EXAMPLE 1

A flux performance is examined by changing kinds of curing agent for an epoxy resin.

After the following test material is applied onto a copper foil and a solder piece which does not contain a flux is placed thereon, the copper foil is heated to 250° C. to melt the solder, and at this time a spread of the solder (flux performance) is observed. The result is shown in the following Table 1.

◯: flux performance present

X: flux performance absent

Δ: between ◯ and X

Here, the test material is formulated by blending the curing agent of Table 1 in approximately equivalent amount into a bisphenol A type epoxy resin ("EPICOAT 828" manufactured by Yuka Shell Epoxy Co., Ltd., epoxy equivalent: 190) and is used.

TABLE 1

| Curing Agent | m.p. (° C.) | Flux Performance |
|---|---|---|
| amine adduct | — | X |
| hydrazide | — | X |
| imidazole | — | X |
| microcapsule type | — | X |
| methyltetrahydrophthalic anhydride | — | X |
| methylhexahydrophthalic anhydride | — | X |
| methylhymic anhydride | — | X |
| trialkyl phthalic anhydride | — | X |
| adipic acid | 153 | ○ |
| terephthalic acid | 245 | ○ |
| cyclohexanedicarboxylic acid | 171-172 | ○ |
| succinic acid | 185 | ○ |
| butanetetracarboxylic acid | 189 | ○ |
| tetrahydrophthalic acid | 163-171 | ○ |
| hexahydrophthalic acid | 185 | ○ |

REFERENCE EXAMPLE 2

A flux performance is examined when methylhymic anhydride and succinic acid are used in combination as the curing agent to bisphenol A type epoxy resin ("EPICOAT 828"). The result is shown in the following Table 2. Here, in the used amount of each curing agent (parts by weight), for example "90" means that, in 100 parts by weight of the epoxy resin, 90 parts by weight thereof is cured.

TABLE 2

| No. | 1 | 2 | 3 | 4 | 5 |
|---|---|---|---|---|---|
| methylhymic anhydride | 90 | 70 | 50 | 40 | 30 |
| succinic acid | 10 | 30 | 50 | 60 | 70 |
| Flux Performance | X | Δ | Δ | ○ | ○ |

EXAMPLES 1, 2 AND COMPARATIVE EXAMPLE 1

The ingredients of parts by weight shown in the following Table 3 are blended to prepare an one-pack thermosetting type epoxy resin composition. The flux performance and the following voidless property are examined and the results are shown together in Table 3.

Voidless Property:

Said epoxy resin composition is applied onto an aluminum plate; a spacer (having a thickness of 50 μm) is placed; a slide glass is put; the resultant is placed on a hot plate (250° C.); and the presence or absence of foaming due to volatilization is confirmed.

|  | Example 1 | Example 2 | Comparative Example 1 |
|---|---|---|---|
| bisphenol A type epoxy resin | 100 | 100 | 100 |
| methylhymic anhydride | 30 | — | 80 |
| succinic acid | 30 | — | — |
| adipic acid | — | 40 | — |
| silica | — | 140 | 180 |
| total | 160 | 280 | 360 |
| Flux Performance | ○ | ○ | X |
| Voidless Property | Δ | ○ | X |

From the results of Table 3, it is recognized that the use of carboxylic acid as a curing agent greatly improves the flux performance and the voidless property as compared with those of acid anhydride.

INDUSTRIAL APPLICABILITY

The one-pack thermosetting type epoxy resin composition of the present invention can be also applied as an adhesive, a paint, a coating material, a sealing material, or the like in addition to the application of an underfilling material.

The invention claimed is:

1. A mounting method of a semiconductor mounted board, which comprises the steps of
   connecting a semiconductor package to a wiring substrate via bumps or solder balls, the semiconductor package comprising a semiconductor element held on a carrier base, followed by
   encapsulating gaps between the bonded parts with a one-pack thermosetting type epoxy resin composition as an underfilling material, the one-pack thermosetting type epoxy resin composition comprising, as essential ingredients,
   a) a liquid epoxy resin,
   b) a carboxylic acid having two or more carboxylic groups in a molecule, as a curing agent, selected from the group consisting of adipic acid, isophthalic acid, terephthalic acid, cyclohexanedicarboxylic acid, succinic acid, butanetetracarboxylic acid, tetrahydrophthalic acid, methyltetrahydrophthalic acid, hexahydrophthalic acid, methylhexahydrophthalic acid, maleic acid, dodecenylsuccinic acid, chlorendic acid, sebacic acid, dodecanedicarboxylic acid, pyromellitic acid, trimellitic acid, cyclopentanetetracarboxylic acid, azelaic acid, icaphoronic acid, 9,10-epoxystearic acid, camphoronic acid, glutaric acid, cyclopropanedicarboxylic acid, cyclopentanedicarboxylic acid, citraconic acid, dimethylsuccinic acid, phenylsuccinic acid, dimethoxyphthalic acid, oxalic acid, suberic acid, tetramethylsuccinic acid, naphthalenedicarboxylic acid, 1,2,3-propanetricarboxylic acid, malonic acid, mesaconic acid, mesoxalic acid, endomethylenetetrahydrophthalic acid, 5-(2,5-dioxotetrahydoxyfuryl)-3-methyl-3-cyclohexene-1,2-dicarboxylic acid, methylnadic acid, 3,3',4,4'-tetracarboxybenzophenone, bis(3,4-dicarboxyphenyl)dimethylsilane, 1,2,3,4-butanetetracarboxylic acid, bis(exo-bicyclo[2.2.1]heptane-2,3-dicarboxylic acid)sulfone, 2,2-bis(3,4-dicarboxyphenoxyphenyl)hexafluoropropane, 1,3-bis(2-hydroxyhexafluoroisopropyl)benzenebis(trimellitic acid), 3,3',4,4'-biphenyl tetracarboxylic acid, 2,3,3',4'-benzophenonetetracarboxylic acid, 2,3,6,7-tetracarboxynaphthalene, 2,2'-bis(3,4-dicarboxyphenyl)propane, 3,4,9,10- perylenetetracarboxylic acid, benzene-1,2,3,4-tetracarboxylic acid, 2,6-dichloronaphthalene-1,4,5,8-tetracarboxylic acid, and pyrrolidine-2,3,4,5-tetracarboxylic acid, c) an acid anhydride, as a curing agent, and d) an imidazole compound selected from the group consisting of 2,4-diamino-6-[2-methylimidazolyl-(1)']-ethyl-S-triazine, 2,4-diamino-6-[2'-ethyl-4'-methyl-imidazolyl-(1)']-ethyl-S-triazine, 2,4-diamino-6-[2'-methylimidazolyl-(1)']-ethyl-S-triazine isocyanuric acid adduct, 2-phenyl-4-methyl-5-hydroxymethyl imidazole, 2-phenyl-4,5-dihydroxymethylimidazole, 2-phenyl-4,5-dihydroxy methylimidazole, 2-aryl-4,5-diphenylimidazole, and 2,4,5-triphenyl imidazole as curing acceleration catalyst.

* * * * *